United States Patent [19]

Feuerbaum et al.

[11] Patent Number: 4,686,466

[45] Date of Patent: Aug. 11, 1987

[54] METHOD FOR AUTOMATICALLY SETTING THE VOLTAGE RESOLUTION IN PARTICLE BEAM MEASURING DEVICES AND APPARATUS FOR IMPLEMENTATION THEREOF

[75] Inventors: Hans-Peter Feuerbaum; Peter Fazekas, both of Munich, Fed. Rep. of Germany

[73] Assignee: Siemens Aktiengesellschaft, Berlin and Munich, Fed. Rep. of Germany

[21] Appl. No.: 705,983

[22] Filed: Feb. 27, 1985

[30] Foreign Application Priority Data

Feb. 27, 1984 [DE] Fed. Rep. of Germany ....... 3407071

[51] Int. Cl.⁴ .............................................. G01R 31/00
[52] U.S. Cl. ................................ 324/158 R; 250/311; 324/71.3
[58] Field of Search ............... 324/71.4, 73 PC, 73 R, 324/158 R, 409, 71.3; 250/310, 396 R, 311

[56] References Cited

U.S. PATENT DOCUMENTS 4,220,853  9/1980  Feuerbaum et al.
4,277,679  7/1981  Feuerbaum .
4,539,477  9/1985  Feuerbaum et al. ............ 324/158 R

FOREIGN PATENT DOCUMENTS 0261488  5/1970  U.S.S.R. ......................... 324/158 R

OTHER PUBLICATIONS

"VLSI Testing Using the Electron Probe", by Feuerbaum, Scanning Electron Microscopy", vol. 1, 1979, pp. 285-296.

"The Observation of Fast Voltage Waveforms in the SEM Using Sampling Techniques", by Thomas et al, IIT Research Inst., 4/76.

"Voltage Comparator System for Contactless Microcircuit Testing", IBM Tech. Disc. Bull., 3/75, vol. 17, #10, pp. 2871-2873.

"Voltage Contrast: A Review, by Gopinath et al, Scanning Electron Microscopy, vol. 1, 1978.

"Gigahertz Stroboscopy with the Scanning Electron Microscope", by Hosopawa et al, Review of Sci. Instrum., 9/78, vol. 49, #9.

Primary Examiner—Reinhard J. Eisenzopf
Assistant Examiner—W. Burns
Attorney, Agent, or Firm—Hill, Van Santen, Steadman & Simpson

[57] ABSTRACT

A method for setting voltage resolution in particle beam measuring devices wherein band width of a measured signal processing is modified. In order to set a desired voltage resolution simply, reliably, and with high precision, a signal noise of the measured signal is measured. This signal noise is compared to a desired value for the measured signal resolution, and the band width of the measured signal processing is modified such that the signal noise of the measured signal is less than or equal to the desired value for the measured signal resolution.

6 Claims, 1 Drawing Figure

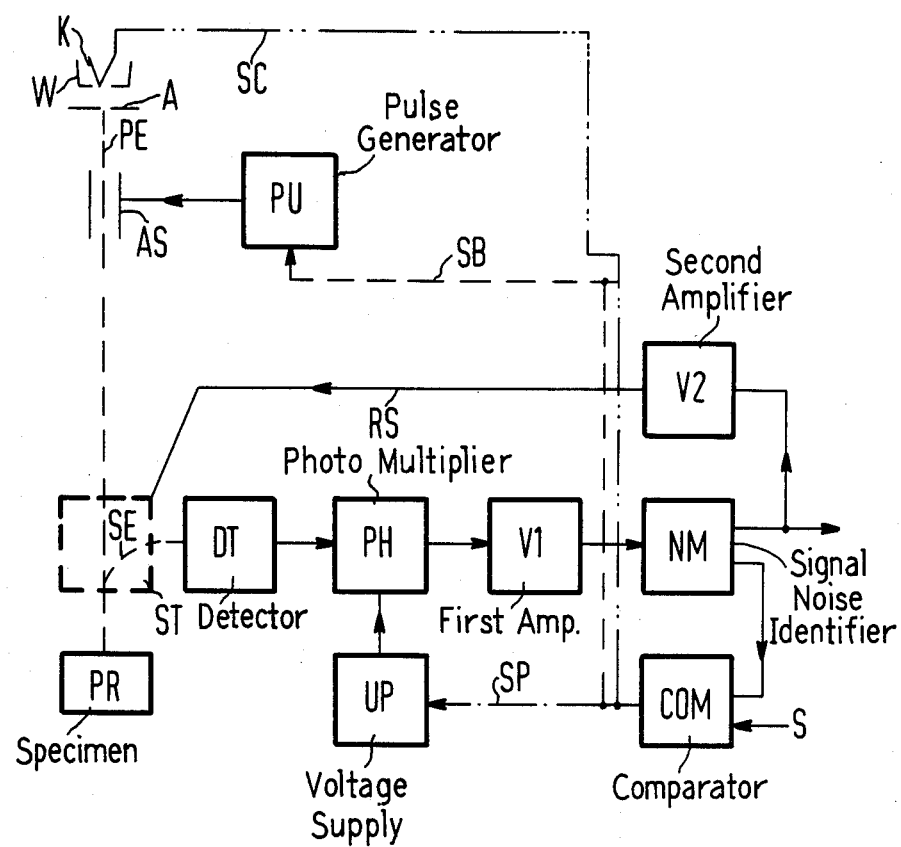

METHOD FOR AUTOMATICALLY SETTING THE VOLTAGE RESOLUTION IN PARTICLE BEAM MEASURING DEVICES AND APPARATUS FOR IMPLEMENTATION THEREOF

BACKGROUND OF THE INVENTION

The invention relates to a method for automatically setting the voltage resolution in particle beam measuring devices.

In electron beam measuring devices, the voltage resolution $\Delta V_{min}$ in the measurement of signal curves is a function of the band width $\Delta f$ of the measured signal processing and of the current $I_{PE}$ of the primary electrons incident upon a measuring location $$\Delta V_{min} = c \cdot \sqrt{\frac{\Delta f}{I_{PE}}}$$

where c is a proportionality constant. The measurement of a signal curve at a measuring location with a specific voltage resolution requires a balancing or matching of the two parameters, namely, the band width $\Delta f$ and the beam current $I_{PE}$. In practice, the beam current $I_{PE}$ is thus held constant.

Up to now, there were two possibilities for setting the voltage resolution according to the prior art. Given both possibilities according to the prior art, the beam current $I_{PE}$ is held constant. According to the first of these two possibilities known from the prior art, the desired voltage resolution is prescribed and the required band width $\Delta f$ is then calculated according to the above-specified equation. This known method has the disadvantage that the proportionality constant c is material-dependent and topography-dependent. Moreover, it is also required for such a calculation that the beam current $I_{PE}$ be known, this depending, among other things, on the selected width and on the frequency of the primary electron pulses in an electron beam measuring device. This method for calculating the required band width $\Delta f$ is therefore complicated and imprecise in practice.

Given a second method known from the prior art for setting a desired voltage resolution, this voltage resolution is subjectively set by an operator by manual selection of the band width $\Delta f$. Such a method is not always successful, so that it is often necessary to repeat signal curve measurements with a modified band width.

SUMMARY OF THE INVENTION

An object of the present invention is to specify a method of the type initially cited and an apparatus for the implementation thereof such that a desired voltage resolution can be set simply, reliably, and with high precision.

This object is achieved according to the invention by measuring signal noise in the measured signal. This signal noise is compared to a desired value for measured signal resolution. A band width of the measured signal processing is modified such that the signal noise of the measured signal is less than or equal to the desired value for the measured signal resolution. Also, based upon the comparison, a pulse-duty factor of the particle beam probe can be varied and/or a probe current of the particle beam probe can be varied.

Developments and advantages of the invention are presented in the sub-claims, the specification, and the drawing.

A method of the invention can be advantageously employed for automatically setting a desired voltage resolu-tion in a particle beam measuring apparatus. In such a case, the computer assumes the setting of the desired voltage reso-lution.

The signal noise of the measured signal can be identified in a separate measuring installation. However, the signal noise can also be identified with the assistance of statistics programs in a computer.

After comparison of the signal noise to a desired voltage resolution, the band width of the measured signal processing is modified such that this signal noise is less than or equal to the desired voltage resolution. The modifi-cation of the band width of the measured signal processing can be controlled by a computer which compares the measured result of the signal noise to the rated value for the voltage resolution. The modification of the band width of the measured signal processing can, however, also occur via a comparator at whose one input the measured result of the signal noise is input and at whose other input the rated value for the voltage resolution is input.

In order to obtain a good voltage resolution, the smallest possible pulse width of the primary electrons is generally selected. The pulse width of the primary electrons then amounts to about 1ns or somewhat less. At the same time, the highest possible probe current in a particle probe is desired in order to enable as small as possible a voltage resolution from the very outset. The beam current $I_{PE}$ of a particle beam probe derives as a function of the probe current, of the pulse width, and of the frequency of the particle pulses. The pulse width and the frequency of the particle pulses can, in turn, be represented as a so-called pulse-duty factor of the particle probe. For as small as possible a voltage resolution, the pulse width of the particle pulses should be as small as possible and the frequency of the particle pulses should be as high as possible.

When a signal curve measurement is to be executed as quickly as possible given a prescribed voltage resolution, then the pulse width of the particle pulses should be as large as possible and the frequency of the particle pulses should be as high as possible. In case pulse widths of the particle pulses of a magnitude of 1 ps can be generated, it is meaningful for setting a desired voltage resolution to not only modify the band width of the measured signal processing alone, but arbitrarily at least, to modify one of the three parameters band width of the measured signal processing, pulse-duty factor of the particle probe, and probe current of the particle probe.

BRIEF DESCRIPTION OF THE DRAWING

The drawing illustrates a system for setting voltage resolution in a particle beam measuring apparatus according to the invention wherein signal noise of a measured signal is compared to a desired value for measured signal resolution.

DESCRIPTION OF THE PREFERRED EMBODIMENTS

The Figure shows an arrangement for the implementation of a method of the invention. The arrangement illustrated in the drawing figure is similar to the electron beam measuring devices which are known from U.S.

Pat. No. 4,220,853, from U.S. Pat. No. 4,277,679, or from German Patent application No. 32 35 484.3, all incorporated herein by reference. Primary electrons PE are emitted by a beam generating system which is composed of a cathode K, of a Wehnelt electrode W, and of an anode A. These primary electrons PE impinge a measuring location on the specimen PR. Both secondary electrons SE as well as backscatter electrons and further particles (not shown in the Figure) are triggered at this measuring location. All of the types of particles triggered at the measuring location can be respectively employed in and of themselves for generating a measured signal. A portion of the secondary electrons SE specified in the illustrative embodiment according to the Figure can overcome the opposing field of an opposing field spectrometer ST. This portion is then documented at the detector DT. The secondary electron measured signal present at the output of the detector DT is amplified in a photo multiplier PH. The output signal of this photo multiplier PH is further amplified in a first amplifier V1 and then arrives at a signal noise identifier NM in which the signal noise of the measured signal is identified. The measured signal is present at an output of this apparatus. This measured signal is further amplified in a second amplifier V2 and finally controls the potential of the opposing field electrode of the opposing field spectrometer ST. The feedback circuit RS is necessary for quantitative potential measurements in order to produce a linear relationship between the measured signal and the potential at the measuring location on the specimen PR. Independently of the potential at the measuring location on the specimen PR, the number of those secondary electrons SE which can overcome the opposing field of the opposing field spectrometer ST and which are documented in the detector DT can be kept constant via the feedback circuit RS.

The measured result of the signal noise is forwarded from the signal noise identifier unit NM to an input of a comparator COM. The rated value S for the voltage resolution is present at the second input of the comparator COM. For setting the voltage resolution, the output of the comparator COM controls the voltage supply UP of the photo multiplier PH via the line SP and thus controls the band width of the measured signal processing in the photo multiplier PH. The output of the comparator COM can control the pulse generator PU via the line SB, said pulse generator PU in turn influencing the pulse width and the pulse frequency of the primary electrons PE via the blanking system AS. The output of the comparator COM can also influence the number of particles via a line SC, namely the number of particles which are emitted by the cathode K.

The comparator COM can be replaced without further complications by a computer. Over and above this, the combination composed of the apparatus NM for measuring the signal noise and of the comparator COM can be replaced by a computer. For this purpose, the computer must have a statistics program available which recognizes the signal noise and can identify it in terms of its magnitude. Such statistics programs are commercially available.

Ion beam devices are also employable in a corresponding fashion instead of electron beam devices.

The comparator COM can be a well-known prior art comparator. A Hewlett Packard Company type 1172 B is employed as the signal noise identifier NM for measuring the signal noise. The remaining units are well known to those skilled in this art.

For various devices discussed above, the following commercially available equipment may be employed:
Pulse generator (PU)-Type: ICT 84-240
Computer (COM)-Type: BASIS 108
Photomultiplier (PH)-Type: EMI 9781B
Voltage supply (UP)-Type: FUG HCN 7E-1250

Although various minor changes and modifications might be proposed by those skilled in the art, it will be understood that we wish to include within the claims of the patent warranted hereon all such changes and modifications as reasonably come within our contribution to the art.

We claim as our invention:

1. A method for setting voltage resolution in a particle beam measuring apparatus utilizing a particle beam probe and which produces a measured signal, and wherein band width of measured signal processing is modified, comprising steps of:
   creating a measured signal in a measured signal processing step;
   measuring signal noise in the measured signal;
   comparing said signal noise to a desired value for measured signal resolution; and
   modifying a band width of the measured signal processing such that the signal noise of the measured signal is less than or equal to said desired value for the measured signal resolution.

2. A method according to claim 1 including a step of varying a pulse-duty factor of the particle beam probe based upon a result of said comparison step.

3. A method according to claim 1 including the step of varying a probe current of the particle beam probe.

4. An apparatus for setting voltage resolution in a particle beam measuring procedure which produces a measured signal, comprising:
   particle beam probe means for generating a signal at a measuring location;
   a measured signal processing means having a specific band width and for producing a measured signal;
   means for modifying a probe current of said particle beam probe means;
   means for modifying a pulse-duty factor of said particle beam probe means;
   signal noise identifier means for measuring a signal noise in the measured signal; and
   means for comparison of said signal noise to a prescribed value for measured signal resolution and for setting at least one of the following parameters: band width, probe current, and pulse-duty factor.

5. An apparatus for setting voltage resolution in a particle beam measuring apparatus which produces a measured signal and wherein a band width of measured signal processing is modified, comprising:
   means for measuring signal noise in the measured signal;
   means for comparing said signal noise to a desired value for measured signal resolution; and
   means for modifying a band width of the measured signal processing such that a signal noise of the measured signal is less than or equal to said desired value for the measured signal resolution.

6. A method for setting voltage resolution in a particle beam measuring apparatus which produces a measuring signal based on a particle beam directed on a specimen, comprising steps of:
   measuring signal noise in the measuring signal;
   comparing said signal noise to a desired measured signal voltage resolution value; and
   modifying at least one of the following parameters: band width in a measuring signal processing step, particle beam probe current, or pulse-duty factor of the particle beam, based upon said comparison step.

* * * * *